(12) United States Patent
Yuan et al.

(10) Patent No.: US 9,915,941 B2
(45) Date of Patent: Mar. 13, 2018

(54) HUMAN-COMPUTER COMBINATION QUALITY TESTING SYSTEM FOR DIGITAL PRODUCT TESTING AND TESTING METHOD THEREOF

(71) Applicant: GUANGDONG ELECTRONICS INDUSTRY INSTITUTE LTD., Dongguan, Guangdong (CN)

(72) Inventors: Zimu Yuan, Guangdong (CN); Ningxin Yuan, Guangdong (CN); Zhiwei Xu, Guangdong (CN); Tongkai Ji, Guangdong (CN)

(73) Assignee: GUANGDONG ELECTRONICS INDUSTRY INSTITUTE LTD., Dongguan, Guangdong (CN)

( * ) Notice: Subject to any disclaimer, the term of this patent is extended or adjusted under 35 U.S.C. 154(b) by 786 days.

(21) Appl. No.: 14/402,098

(22) PCT Filed: Aug. 23, 2013

(86) PCT No.: PCT/CN2013/082235
§ 371 (c)(1),
(2) Date: Nov. 18, 2014

(87) PCT Pub. No.: WO2015/024268
PCT Pub. Date: Feb. 26, 2015

(65) Prior Publication Data
US 2017/0343995 A1    Nov. 30, 2017

(30) Foreign Application Priority Data

Aug. 21, 2013  (CN) .......................... 2013 1 0368147

(51) Int. Cl.
G05B 15/02        (2006.01)
G05B 19/418       (2006.01)
G06F 17/50        (2006.01)

(52) U.S. Cl.
CPC ....... *G05B 19/41875* (2013.01); *G06F 17/50* (2013.01); *G05B 2219/32189* (2013.01); *G06F 2217/14* (2013.01)

(58) Field of Classification Search
CPC .......................... G05B 19/41875; G06F 17/50
See application file for complete search history.

(56) References Cited

U.S. PATENT DOCUMENTS

| | | | |
|---|---|---|---|
| 4,065,212 A * | 12/1977 | Belleson | G01N 21/898 250/237 G |
| 2003/0097238 A1* | 5/2003 | Harmon | A61B 5/0002 702/183 |

(Continued)

*Primary Examiner* — Vincent Tran

(57) ABSTRACT

A testing method of a human-computer combination quality testing system includes steps of: after manufacture, importing relevant CAD models, submitting the CAD models to a digital testing part for being examined; if a product is determined to be unqualified, returning the product for retreatment; if the product is determined to be qualified, submitting the product to a manual testing part for being examined by relevant inspectors; if the product is determined to be qualified by the inspectors, leaving the product as a qualified product; if the product is determined to be unqualified by the inspectors, returning the product for retreatment; then changing the relevant rule with a rule corrector of a system improving part according to a misjudging condition of the digital testing part; describing a corrected rule, which is corrected by the developer, by a rule descriptor; then applying the corrected rule to a system by a rule parser.

9 Claims, 3 Drawing Sheets

(56) References Cited

U.S. PATENT DOCUMENTS

| | | | |
|---|---|---|---|
| 2007/0117225 A1* | 5/2007 | Capaldo | G01N 21/8806 438/14 |
| 2008/0288443 A1* | 11/2008 | Darbie | G06F 11/2257 |
| 2012/0123990 A1* | 5/2012 | Eckardt | G06F 8/10 706/47 |
| 2015/0338846 A1* | 11/2015 | Boivin | G06Q 50/04 702/84 |
| 2016/0209836 A1* | 7/2016 | Rataul | G05B 19/41805 |

* cited by examiner

HUMAN-COMPUTER COMBINATION QUALITY TESTING SYSTEM FOR DIGITAL PRODUCT TESTING AND TESTING METHOD THEREOF

CROSS REFERENCE OF RELATED APPLICATION

This is a U.S. National Stage under 35 U.S.C 371 of the International Application PCT/CN2013/082235, filed Aug. 23, 2013, which claims priority under 35 U.S.C. 119(a-d) to CN 201310368147, filed Aug. 21, 2013.

BACKGROUND OF THE PRESENT INVENTION

Field of Invention

The present invention relates to a technical field of product quality testing, and more particularly to a human-computer combination quality testing system for digital product testing which combines personal experience and instrument examination, and a testing method thereof.

Description of Related Arts

Until digital product quality testing is popularized in an industry, product quality control is handled by experienced workers or the one who has sufficiently learned the relevant testing knowledge. Usually, the examiner will judge products by appearance, texture, etc., which is based on personal perception, for finding out unqualified products. However, a man is not a machine, and it is impossible to keep focusing on the product testing. As a result, being unfocused may cause neglect of unqualified products. Furthermore, not everyone has a complete knowledge of the product, and incomplete knowledge may also cause neglect of unqualified products. Once there are too many parts of the product to be tested or testing process is too long, it will take a certain time for one to examine each product, which will lower production efficiency and product yields. In some companies or factories in certain industries, product testing is in a workflow form, and each person is only responsible for a small part of product quality testing. However, problems of being unfocused and low production efficiency still exist.

Some industries introduce digital product quality testing systems (as illustrated in FIG. 1). By pre-inputting prior knowledge to a rule library of the system, whether a product is qualified is determined by component testing, fit testing and drawing testing. Digital product quality testing system is able to improve the efficiency of product testing and save a lot of time compared with manual production quality testing, which increases production efficiency and qualified product yields. Although the digital product quality testing system improves the testing efficiency, the problem of incomplete knowledge still exists. Developers of the digital system often do not have specific product knowledge. Therefore, detailed description by specialists is necessary for the development. Both the developers and the specialists are not able to completely and precisely input relevant testing logic rules into the system only through communication during development, and may even input wrong testing logic because of misunderstanding. Especially, for complex or multi-environment systems, the system is more likely to be incomplete or wrong.

As long as the products are tested only by personal experience or digital testing system, problems of incomplete knowledge, misunderstanding and efficiency exist. By combining advantages of both sides and learning from each other, product quality testing processes is improvable.

SUMMARY OF THE PRESENT INVENTION

A first object of the present invention is to provide a human-computer combination quality testing system for solving problems such as neglect and misjudgment, which combines and takes advantages of digital testing and manual testing for improving testing processes and a detection rate of unqualified products.

A second object of the present invention is to provide a testing method of a human-computer combination quality testing system for solving problems such as neglect and misjudgment, which combines and takes advantages of digital testing and manual testing for improving testing processes and a detection rate of unqualified products.

Accordingly, in order to accomplish the first object, the present invention provides:

a human-computer combination quality testing system for digital product testing and a testing method thereof, comprising: a digital testing part, a manual testing part, and a system improving part;

wherein the digital testing part comprises: a component model testing, a fit model testing and an engineering drawing testing;

the manual testing part is appraising of products from parts and assembly to end products by an inspector, for separating unqualified products from qualified products;

the system improving part comprises: a rule descriptor, a rule parser, and a rule corrector;

wherein the rule descriptor comprises: rule bindings, trigger conditions, degree types and reply types; the rule bindings comprise at least one of a component model testing binding, a fit model testing binding and an engineering drawing testing binding; the trigger conditions comprise standard conditions set according to standards of a point-line model, surfaces, boundaries and textures of a component model; restriction conditions set according to restrictions comprising an assembly relationship and an assembly sequence of a fit model; and correlation conditions set according to size and view correlations between an engineering drawing and a model; the degree types are represented in a quantized percentage form according to requirements; the reply types comprise: an adjust-type, a modify-type and a redo-type, and the reply types are correlated with the degree types;

the rule parser parses semantemes described in a rule, the parsed semantemes comprise relationships between symbols and basic elements comprising the point-line model, the surfaces and the textures; restrictions comprising proportions, associations, contents and sequences; and movements comprising hitting, squeezing and measuring;

the rule corrector provides an interface for editing the rule, so as to expand, modify, delete and query the rule.

Preferably, the rule descriptor sets the standard conditions according to the standards of points, lines, the surfaces, the boundaries and the textures of the component model; sets the restriction conditions according to the restrictions comprising the assembly relationship and the assembly sequence of the fit model; and sets correlation conditions according to the size and view correlations between the engineering drawing and the model; if the conditions are abnormal, a rule is triggered for warming about an irregularity detected;

wherein the standards of the component model are described by a chain table structure; the points, the lines and the boundaries are described by a 1-dimensional chain table structure, each element thereof is directed to a next element by a pointer and is described as Element=(x,y,z) for describing a 3-dimensional point position; the surfaces and the textures are described by a 2-dimensional chain table structure, each element thereof is directed to an up element, a down element, a left element and a right element by four pointers and is described as Element=(x,y,z,d), wherein x, y and z describe a 3-dimensional point position, d describes the texture at (x,y,z); ownerships of the fit model are described by sets, wherein $S_1 \subseteq S_2$ illustrates that parts represented by $S_1$ are subordinate to parts represented by $S_2$; $S_1 \cap S_2$ illustrates that the parts represented by $S_1$ and the parts represented by $S_2$ should be assembled together for forming a part; the assembly sequence of the fit model is described by an order set, wherein $<S_1, S_2, \ldots, S_n>$ illustrates that $S_1$ is assembled first, then $S_2$, and finally $S_n$; the size correlation between the engineering drawing and the model is described by a scale; the view correlation between the engineering drawing and the model is described as G=(V,E), wherein V is an apex set of a view, E is a vector side set of the view; $v_1$ and $v_2$ respectively represent two views, $e_{12}$ describes a correlation between $v_1$ and $v_2$; standard settings, assembly restrictions and correlation rules defined above form the trigger conditions, the trigger conditions are marked as C.

Preferably, a rule of the rule bindings of the rule descriptor is described as $<Logic(C_1, C_2, \ldots, C_m)$, Component/Fit/Drawing>, wherein $Logic(C_1, C_2, \ldots, C_m)$ is a logic system comprising a series of trigger rules, which is corresponding to Component/Fit/Drawing; the logic system comprises $\wedge$, $\vee$ and $-$ basic operations, wherein $C_1 \wedge C_2$ requires that both $C_1$ and $C_2$ are true, $C_1 \vee C_2$ requires that either $C_1$ or $C_2$ is true, and $\overline{C_1}$ requires that $C_1$ is not true; the rule is marked as R;

wherein the degree types are represented in the quantized percentage form, for describing irregular degrees; each rule is corresponding to one degree type, which is marked as <R,Degree,Reply>; the irregular degrees are adjustable according to requirements; for example, Degree of 1%~10% represents a slight irregularity with slight inconformity and mistakes, Degree of 11%~30% represents a medium type with a medium irregularity; Degree of above 30% represents a serious irregularity;

wherein the reply types comprise: the adjust-type, the modify-type and the redo-type, which depend on the irregular degrees and are corresponding to one rule and one degree type; the adjust-type is corresponding to the slight irregularity, the modify-type is corresponding to the medium irregularity, and the redo-type is corresponding to the serious irregularity.

Preferably, the component model testing of the digital testing part determines whether elements comprising the points, the lines, the surfaces, the boundaries and the textures are qualified, wherein the points, the lines and the boundaries are described by the 1-dimensional chain table, the surfaces and the textures are described by the 2-dimensional chain table;

wherein the fit model testing of the digital testing part determines whether the components are assembled fitly, and examines the restrictions comprising the assembly relationship and the assembly sequence; the ownership is represented by set operations; the assembly sequence is described by the order set;

wherein the engineering drawing testing of the digital testing part detects the size and view correlations between the engineering drawing and the model, the size correlation between the engineering drawing and the model is described by the scale; and the view correlation between the engineering drawing and the model is described as G=(V,E), wherein V represents a view set, and E represents a relationship set of the view correlation.

Accordingly, in order to accomplish the first object, the present invention provides:

a testing method of a human-computer combination quality testing system, comprising steps of: after manufacture, importing relevant CAD models, submitting the CAD models to a digital testing part for being examined; examining in sequence with component model testing, fit model testing and engineering drawing testing for determining whether a relevant rule is disobeyed; if a product is determined to be unqualified by the three testing, returning the product for being adjusted, modified or redone; if the product is determined to be qualified by the three testing, submitting the product to a manual testing part for being examined by relevant inspectors; if the product is determined to be qualified by the inspectors, leaving the product as a qualified product; if the product is determined to be unqualified by the inspectors, returning the product for being adjusted, modified or redone, and submitting an explanation to a developer; then adding, changing or deleting the relevant rule with a rule corrector of a system improving part according to a misjudging condition of the digital testing part; describing a corrected rule, which is corrected by the developer, by a rule descriptor; then applying the corrected rule to a system by a rule parser for avoiding the misjudging condition.

Therefore, with the system improving part, the human-computer combination quality testing system does not requires a completed rule library of a system rule library at the beginning. The rule library keeps being improved with growth of time and experience, or with changes of system testing requirements, for completing the system. At the meantime, an improving process and a manufacturing process are able to be provided at the same time, in such a manner that there is no need to stop producing.

BRIEF DESCRIPTION OF THE DRAWINGS

Referring to the drawings, the present invention is further illustrated.

DETAILED DESCRIPTION OF THE PREFERRED EMBODIMENT

Figure 1:
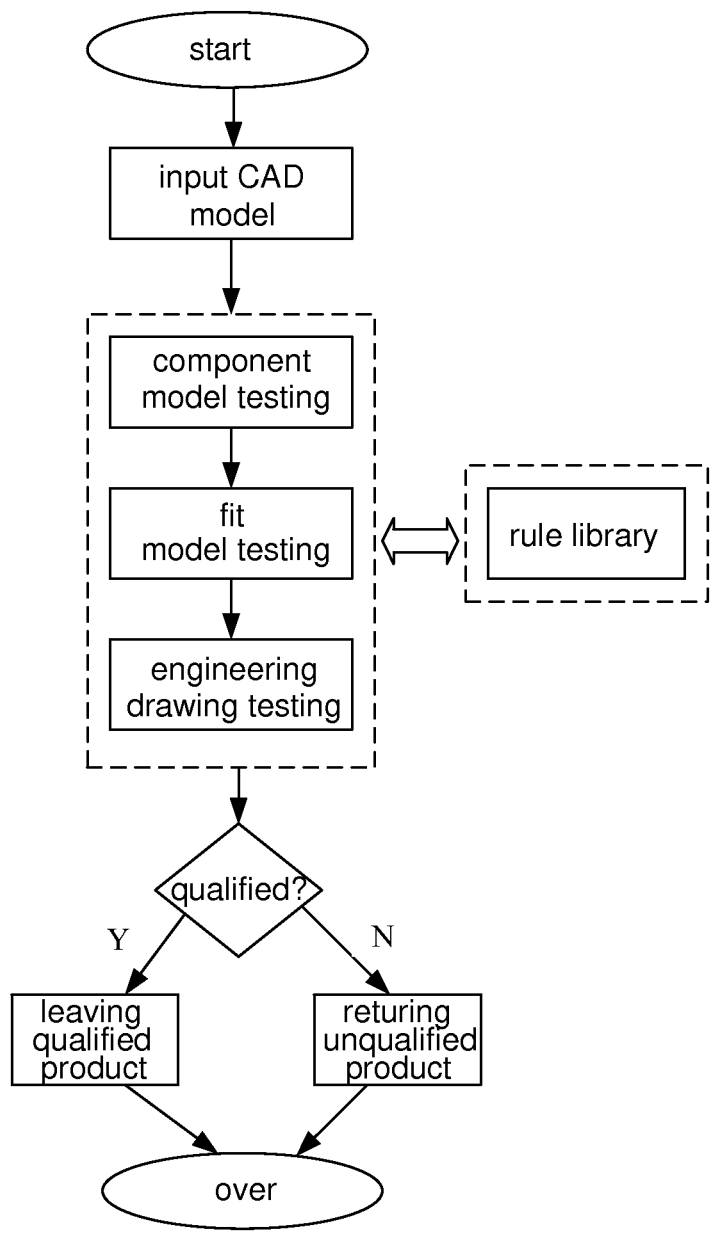
FIG. 1 is a sketch view of a conventional digital product quality testing system.
Figure 2:
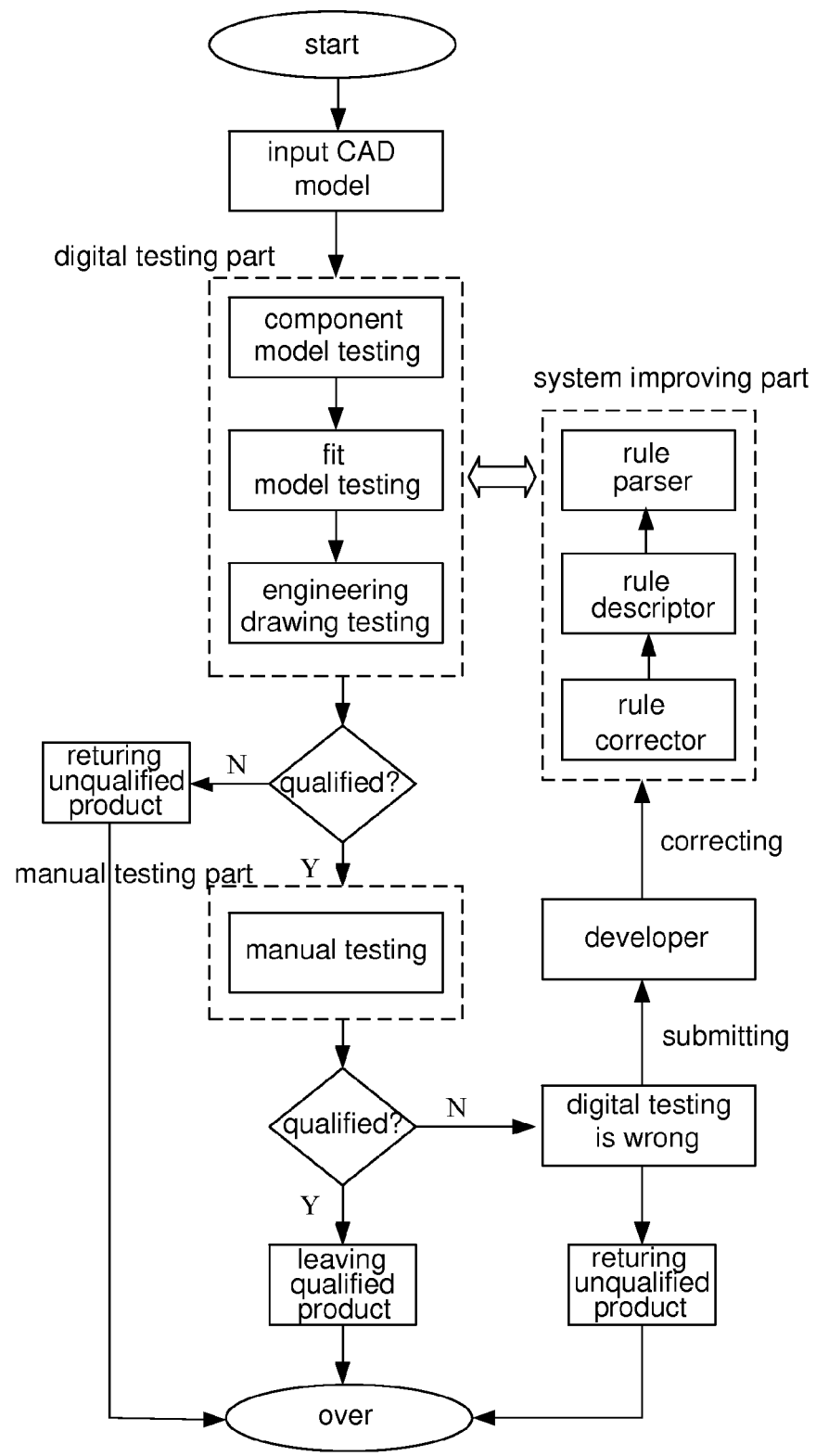
FIG. 2 is a sketch view of a human-computer combination quality testing system according to the present invention.

Referring to FIG. 2, a human-computer combination quality testing system according to the present invention comprises: a digital testing part, a manual testing part, and a system improving part.

The digital testing part may be an original system without human-computer combination, which does not need to be changed. The digital testing part comprises: a component model testing, a fit model testing and an engineering drawing testing. The component model testing determines whether elements comprising the point-line models, surfaces, boundaries and textures are qualified. The fit model testing determines whether components are assembled fitly, and examines restrictions comprising an assembly relationship and an assembly sequence. The engineering drawing testing detects size and view correlations between an engineering drawing and a model.

The manual testing part is appraising of products from parts and assembly to end products by an inspector with manufacturing and assembling experience, for separating unqualified products from qualified products.

The system improving part comprises: a rule descriptor, a rule parser, and a rule corrector.

The rule descriptor is a four-element group (Condition, Binding, Type, Reply), comprising: rule bindings Binding, trigger conditions Condition, degree types Degree and reply types Reply.

Figure 3:
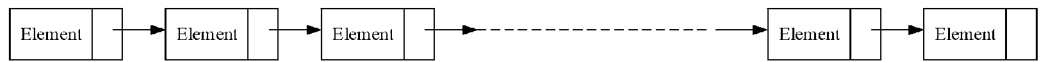
FIG. 3 is a sketch view of a point-line model according to the present invention.
Figure 4:
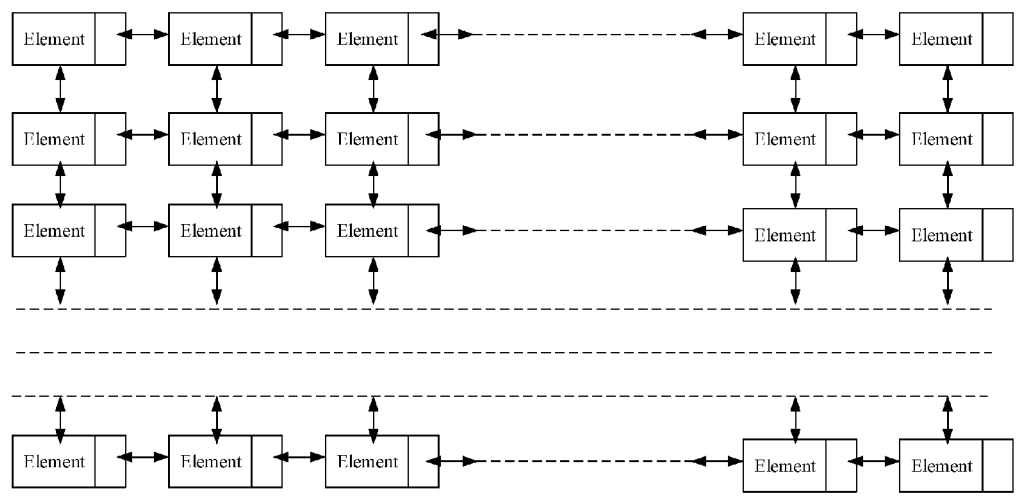
FIG. 4 is a sketch view of a surface model according to the present invention.
Figure 5:
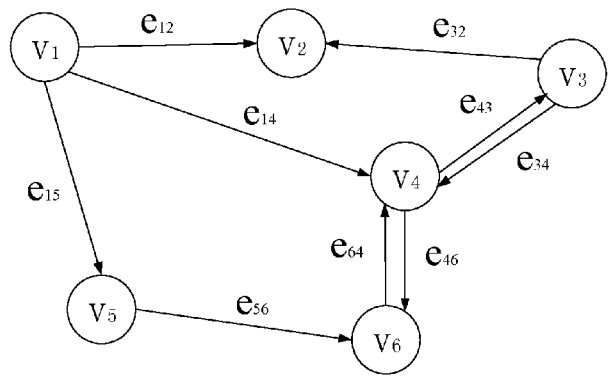
FIG. 5 is a sketch view of a view correlation according to the present invention.

The rule descriptor comprises the trigger conditions Condition. The rule descriptor sets the standard conditions according to the standards of points, lines, the surfaces, the boundaries and the textures of a component model; sets the restriction conditions according to the restrictions comprising the assembly relationship and the assembly sequence of the fit model; and sets correlation conditions according to the size and view correlations between the engineering drawing and the model. If the conditions are abnormal, a rule is triggered for warming about an irregularity detected. The standards of the component model are described by a chain table structure; the points, the lines and the boundaries are described by a 1-dimensional chain table structure, each element thereof is directed to a next element by a pointer as shown in FIG. 3, and is described as Element=(x,y,z) for describing a 3-dimensional point position. The surfaces and the textures are described by a 2-dimensional chain table structure, each element thereof is directed to an up element, a down element, a left element and a right element by four pointers as shown in FIG. 4, and is described as Element=(x,y,z,d), wherein x, y and z describe a 3-dimensional point position, d describes the texture at (x,y,z). Ownerships of the fit model are described by sets, wherein $S_1 \subseteq S_2$ illustrates that parts represented by $S_1$ are subordinate to parts represented by $S_2$; $S_1 \cap S_2$ illustrates that the parts represented by $S_1$ and the parts represented by $S_2$ should be assembled together for forming a part. The assembly sequence of the fit model is described by an order set, wherein $<S_1, S_2, \ldots, S_n>$ illustrates that $S_1$ is assembled first, then $S_2$, and finally $S_n$. The size correlation between the engineering drawing and the model is described by a scale. The view correlation between the engineering drawing and the model is described as G=(V,E), wherein V is an apex set of a view, E is a vector side set of the view. Referring to FIG. 5, $v_1$ and $v_2$ respectively represent two views, $e_{12}$ describes a correlation between $v_1$ and $v_2$; standard settings, assembly restrictions and correlation rules defined above form the trigger conditions, the trigger conditions are marked as C.

The rule descriptor comprises the rule bindings Binding. For each unit of the digital testing part, such as the component model testing (Component for short), the fit model testing (Fit for short) and the engineering drawing testing (Drawing for short), requirements for quality testing are different, and corresponding rules are also different. Different units of the digital testing part are bounded with different rules. The rule is described as $<\text{Logic}(C_1, C_2, \ldots, C_m)$, Component/Fit/Drawing$>$, wherein Logic$(C_1, C_2, \ldots, C_m)$ is a logic system comprising a series of trigger rules, which is corresponding to Component/Fit/Drawing; the logic system comprises $\land$, $\lor$ and $-$ basic operations, wherein $C_1 \land C_2$ requires that both $C_1$ and $C_2$ are true, $C_1 \lor C_2$ requires that either $C_1$ or $C_2$ is true, and $\overline{C}_1$ requires that $C_1$ is not true; the rule is marked as R.

The rule descriptor comprises the degree types Degree, wherein the degree types are represented in the quantized percentage form, for describing irregular degrees; each rule is corresponding to one degree type, which is marked as <R,Degree,Reply>; the irregular degrees are adjustable according to requirements; for example, Degree of 1%~10% represents a slight irregularity with slight inconformity and mistakes, Degree of 11%~30% represents a medium type with a medium irregularity; Degree of above 30% represents a serious irregularity.

The rule descriptor comprises the reply types Reply, wherein the reply types comprise: the adjust-type (Adjust for short), the modify-type (Modify for short) and the redo-type (Redo for short), which depend on the irregular degrees and are corresponding to one rule and one degree type, and are described as <R,Degree,Reply>. The adjust-type is corresponding to the slight irregularity, the modify-type is corresponding to the medium irregularity, and the redo-type is corresponding to the serious irregularity.

The rule parser parses semantemes described in the rule, the parsed semantemes comprise relationships between symbols and basic elements comprising the point-line model, the surfaces and the textures; restrictions comprising proportions, associations, contents and sequences; and movements comprising hitting, squeezing and measuring.

The rule corrector provides an interface for editing the rule. For the rules which are determined as wrong, a deleting operation may be provided, which means providing Delete (<R,Degree,Reply>). For incomplete rule libraries, an adding operation may be provided, which means providing Add(<R,Degree,Reply>). For the rules with problems, a modifying operation may be provided, which means providing Modify(<R,Degree,Reply>). For all the rules in the rule library, a querying operation may be provided, which means providing Query(<R,Degree,Reply>).

Referring to FIG. 2, a testing method of a human-computer combination quality testing system is provided, comprising steps of: after manufacture, importing relevant CAD models, submitting the CAD models to a digital testing part for being examined; examining with component model testing, fit model testing and engineering drawing testing for determining whether a relevant rule is disobeyed; if a product is determined to be unqualified by the three testing, returning the product for being adjusted, modified or redone; if the product is determined to be qualified by the three testing, submitting the product to a manual testing part for being examined by relevant inspectors; if the product is determined to be qualified by the inspectors, leaving the product as a qualified product; if the product is determined to be unqualified by the inspectors, which means that a result of the digital testing part is wrong, returning the product for being adjusted, modified or redone, and submitting an explanation to a developer; then adding, changing or deleting the relevant rule with a rule corrector of a system improving part according to a misjudging condition of the digital testing part; describing a corrected rule, which is corrected by the developer, by a rule descriptor; then applying the corrected rule to a system by a rule parser for avoiding the misjudging condition.

What is claimed is:
1. A human-computer combination quality testing system for digital product testing, comprising: a digital testing part, a manual testing part, and a system improving part;

wherein said digital testing part comprises: a component model testing, a fit model testing and an engineering drawing testing;

said manual testing part is appraising of products from parts and assembly to end products by an inspector, for separating unqualified products from qualified products;

said system improving part comprises: a rule descriptor, a rule parser, and a rule corrector;

wherein said rule descriptor comprises: rule bindings, trigger conditions, degree types and reply types; said rule bindings comprise at least one of a component model testing binding, a fit model testing binding and an engineering drawing testing binding; said trigger conditions comprise standard conditions set according to standards of a point-line model, surfaces, boundaries and textures of a component model; restriction conditions set according to restrictions comprising an assembly relationship and an assembly sequence of a fit model; and correlation conditions set according to a size correlation and a view correlation between an engineering drawing and a model; said degree types are represented in a quantized percentage form according to requirements; said reply types comprise: an adjust-type, a modify-type and a redo-type, and said reply types are correlated with said degree types;

said rule parser parses sememes described in a rule, said parsed sememes comprise relationships between symbols and basic elements comprising the point-line model, the surfaces and the textures; restrictions comprising proportions, associations, contents and sequences; and movements comprising hitting, squeezing and measuring;

said rule corrector provides an interface for editing the rule, so as to expand, modify, delete and query the rule.

2. The human-computer combination quality testing system, as recited in claim 1, wherein said rule descriptor sets said standard conditions according to said standards of points, lines, said surfaces, said boundaries and said textures of said component model; sets said restriction conditions according to said restrictions comprising said assembly relationship and said assembly sequence of said fit model; and sets correlation conditions according to said size and view correlations between said engineering drawing and said model; if said conditions are abnormal, a rule is triggered for warming about an irregularity detected;

wherein said standards of said component model are described by a chain table structure; said points, said lines and said boundaries are described by a 1-dimensional chain table structure, each element thereof is directed to a next element by a pointer and is described as Element=(x,y,z) for describing a 3-dimensional point position; said surfaces and said textures are described by a 2-dimensional chain table structure, each element thereof is directed to an up element, a down element, a left element and a right element by four pointers and is described as Element=(x,y,z,d), wherein x, y and z describe a 3-dimensional point position, d describes said texture at (x,y,z); ownerships of said fit model are described by sets, wherein $S_1 \subseteq S_2$ illustrates that parts represented by $S_1$ are subordinate to parts represented by $S_2$; $S_1 \cap S_2$ illustrates that said parts represented by $S_1$ and said parts represented by $S_2$ should be assembled together for forming a part; said assembly sequence of said fit model is described by an order set, wherein $<S_1, S_2, \ldots, S_n>$ illustrates that $S_1$ is assembled first, then $S_2$, and finally $S_n$; said size correlation between said engineering drawing and said model is described by a scale; said view correlation between said engineering drawing and said model is described as G=(V,E), wherein V is an apex set of a view, E is a vector side set of said view; $v_1$ and $v_2$ respectively represent two views, $e_{12}$ describes a correlation between $v_1$ and $v_2$; standard settings, assembly restrictions and correlation rules defined above form said trigger conditions, said trigger conditions are marked as C.

3. The human-computer combination quality testing system, as recited in claim 2, wherein a rule of said rule bindings of said rule descriptor is described as <Logic($C_1$, $C_2, \ldots, C_m$), Component/Fit/Drawing>, wherein Logic($C_1$, $C_2, \ldots, C_m$) is a logic system comprising a series of trigger rules, which is corresponding to Component/Fit/Drawing; said logic system comprises $\wedge$, $\vee$ and $-$ basic operations, wherein $C_1 \wedge C_2$ requires that both $C_1$ and $C_2$ are true, $C_1 \vee C_2$ requires that either $C_1$ or $C_2$ is true, and $\overline{C_1}$ requires that $C_1$ is not true; said rule is marked as R;

wherein said degree types are represented in said quantized percentage form, for describing irregular degrees; each rule is corresponding to one degree type, which is marked as <R,Degree,Reply>; said irregular degrees are adjustable according to requirements; for example, Degree of 1%~10% represents a slight irregularity with slight inconformity and mistakes, Degree of 11%~30% represents a medium type with a medium irregularity; Degree of above 30% represents a serious irregularity;

wherein said reply types comprise: said adjust-type, said modify-type and said redo-type, which depend on said irregular degrees and are corresponding to one rule and one degree type; said adjust-type is corresponding to said slight irregularity, said modify-type is corresponding to said medium irregularity, and said redo-type is corresponding to said serious irregularity.

4. The human-computer combination quality testing system, as recited in claim 3, wherein said component model testing of said digital testing part determines whether elements comprising said points, said lines, said surfaces, said boundaries and said textures are qualified, wherein said points, said lines and said boundaries are described by said 1-dimensional chain table, said surfaces and said textures are described by said 2-dimensional chain table;

wherein said fit model testing of said digital testing part determines whether said components are assembled fitly, and examines said restrictions comprising said assembly relationship and said assembly sequence; said ownership is represented by set operations; said assembly sequence is described by said order set;

wherein said engineering drawing testing of said digital testing part detects said size and view correlations between said engineering drawing and said model, said size correlation between said engineering drawing and said model is described by said scale; and said view correlation between said engineering drawing and said model is described as G=(V,E), wherein V represents a view set, and E represents a relationship set of said view correlation.

5. The human-computer combination quality testing system, as recited in claim 2, wherein said component model testing of said digital testing part determines whether elements comprising said points, said lines, said surfaces, said boundaries and said textures are qualified, wherein said points, said lines and said boundaries are described by said 1-dimensional chain table, said surfaces and said textures are described by said 2-dimensional chain table;

wherein said fit model testing of said digital testing part determines whether said components are assembled fitly, and examines said restrictions comprising said assembly relationship and said assembly sequence; said ownership is represented by set operations; said assembly sequence is described by said order set;

wherein said engineering drawing testing of said digital testing part detects said size and view correlations between said engineering drawing and said model, said size correlation between said engineering drawing and said model is described by said scale; and said view correlation between said engineering drawing and said model is described as $G=(V,E)$, wherein V represents a view set, and E represents a relationship set of said view correlation.

6. The human-computer combination quality testing system, as recited in claim 1, wherein a rule of said rule bindings of said rule descriptor is described as <Logic($C_1$, $C_2$, ..., $C_m$), Component/Fit/Drawing>, wherein Logic($C_1$, $C_2$, ..., $C_m$) is a logic system comprising a series of trigger rules, which is corresponding to Component/Fit/Drawing; said logic system comprises ∧, ∨ and − basic operations, wherein $C_1 \wedge C_2$ requires that both and $C_1$ and $C_2$ are true, $C_1 \vee C_2$ requires that either $C_1$ or $C_2$ is true, and $\overline{C}_1$ requires that $C_1$ is not true; said rule is marked as R;

wherein said degree types are represented in said quantized percentage form, for describing irregular degrees; each rule is corresponding to one degree type, which is marked as <R,Degree,Reply>; said irregular degrees are adjustable according to requirements; for example, Degree of 1%~10% represents a slight irregularity with slight inconformity and mistakes, Degree of 11%~30% represents a medium type with a medium irregularity; Degree of above 30% represents a serious irregularity;

wherein said reply types comprise: said adjust-type, said modify-type and said redo-type, which depend on said irregular degrees and are corresponding to one rule and one degree type; said adjust-type is corresponding to said slight irregularity, said modify-type is corresponding to said medium irregularity, and said redo-type is corresponding to said serious irregularity.

7. The human-computer combination quality testing system, as recited in claim 6, wherein said component model testing of said digital testing part determines whether elements comprising said points, said lines, said surfaces, said boundaries and said textures are qualified, wherein said points, said lines and said boundaries are described by said 1-dimensional chain table, said surfaces and said textures are described by said 2-dimensional chain table;

wherein said fit model testing of said digital testing part determines whether said components are assembled fitly, and examines said restrictions comprising said assembly relationship and said assembly sequence; said ownership is represented by set operations; said assembly sequence is described by said order set;

wherein said engineering drawing testing of said digital testing part detects said size and view correlations between said engineering drawing and said model, said size correlation between said engineering drawing and said model is described by said scale; and said view correlation between said engineering drawing and said model is described as $G=(V,E)$, wherein V represents a view set, and E represents a relationship set of said view correlation.

8. The human-computer combination quality testing system, as recited in claim 1, wherein said component model testing of said digital testing part determines whether elements comprising said points, said lines, said surfaces, said boundaries and said textures are qualified, wherein said points, said lines and said boundaries are described by a 1-dimensional chain table, said surfaces and said textures are described by a 2-dimensional chain table;

wherein said fit model testing of said digital testing part determines whether said components are assembled fitly, and examines said restrictions comprising said assembly relationship and said assembly sequence; said ownership is represented by set operations; said assembly sequence is described by an order set;

wherein said engineering drawing testing of said digital testing part detects said size and view correlations between said engineering drawing and said model, said size correlation between said engineering drawing and said model is described by a scale; and said view correlation between said engineering drawing and said model is described as $G=(V,E)$, wherein V represents a view set, and E represents a relationship set of said view correlation.

9. A testing method of a human-computer combination quality testing system for a digital product testing, comprising steps of: after manufacture, importing relevant CAD models, submitting the CAD models to a digital testing part for being examined; examining in sequence with component model testing, fit model testing and engineering drawing testing for determining whether a relevant rule is disobeyed; if a product is determined to be unqualified by the three testing, returning the product for being adjusted, modified or redone; if the product is determined to be qualified by the three testing, submitting the product to a manual testing part for being examined by relevant inspectors; if the product is determined to be qualified by the inspectors, leaving the product as a qualified product; if the product is determined to be unqualified by the inspectors, returning the product for being adjusted, modified or redone, and submitting an explanation to a developer; then adding, changing or deleting the relevant rule with a rule corrector of a system improving part according to a misjudging condition of the digital testing part; describing a corrected rule, which is corrected by the developer, by a rule descriptor; then applying the corrected rule to a system by a rule parser for avoiding the misjudging condition.

\* \* \* \* \*